United States Patent [19]
Lee et al.

[11] Patent Number: 6,037,221
[45] Date of Patent: Mar. 14, 2000

[54] DEVICE AND FABRICATING METHOD OF NON-VOLATILE MEMORY

[75] Inventors: Sung Chul Lee; Min Gyu Lim, both of Seoul, Rep. of Korea

[73] Assignee: LG Semicon Co., Ltd., Chungcheongbuk-Do, Rep. of Korea

[21] Appl. No.: 08/790,859

[22] Filed: Feb. 3, 1997

[30]     Foreign Application Priority Data

Aug. 6, 1996 [KR] Rep. of Korea ...................... 96-32735

[51] Int. Cl.⁷ .................................................. H01L 29/72
[52] U.S. Cl. ......................... 438/257; 438/201; 438/211; 438/303; 438/524; 438/700; 257/315; 257/316; 257/401
[58] Field of Search ..................................... 257/315, 316, 257/401; 438/201, 211–257, 303, 524, 700

[56]     References Cited

U.S. PATENT DOCUMENTS 5,070,032  12/1991  Yuan et al. ................................ 437/43
5,880,499   3/1999  Oyama ..................................... 257/315

Primary Examiner—Edward Wojciechowicz
Attorney, Agent, or Firm—Morgan, Lewis & Bockius LLP

[57]     ABSTRACT

A non-volatile memory device includes a substrate, a projection having two sides formed on the substrate, a floating gate formed on the projection, a control gate formed on the substrate including the floating gate, a first impurity region formed in the substrate extended from one side of the projection, and a second impurity region formed in the substrate at the other side of the projection and in the substrate extended from the other side of the projection.

22 Claims, 4 Drawing Sheets

DEVICE AND FABRICATING METHOD OF NON-VOLATILE MEMORY

BACKGROUND OF THE INVENTION

1. Field of the Invention

The present invention relates to a non-volatile memory device, and more particularly, to a non-volatile memory cell capable of suppressing a leakage current caused by over-erasure and a method for fabricating the same.

2. Discussion of the Related Art

In general, there are two different structures in a conventional flash EEPROM (Electrically Erasable and Programmable Read Only Memory) cell of the non-volatile memory cell: an Eprom (Erasable and Programmable Read Only Memory) Tunnel Oxide (ETOX) structure and a split-gate structure.

Referring to FIG. 1, as a first example of the conventional flash EEPROM, the ETOX structure includes a semiconductor substrate 1, a floating gate insulating film 2 formed on the semiconductor substrate 1, a floating gate 3 formed on the floating gate insulating film 2, a control gate insulating film 4 formed on the floating gate 3, a control gate 5 formed on the control gate insulating film 4, and source 6 and drain 7 formed in the semiconductor substrate 1 at both sides of the control gate 5.

The operations of the conventional flash EEPROM having the aforementioned system will now be described.

During the writing operation, a source 6 of a control transistor (not shown) as a memory cell is grounded, and a control gate 5 and a drain 7 are applied with voltages of 12 V and 7 V, respectively. Then, hot carriers in the channel region are charged in the floating gate 3 to store data. During the erasing operation, the source 6 is applied with 12 V, or the control gate 5 is applied with a negative voltage, to erase the charges in the floating gate 3 while keeping the control gate 5 grounded and the drain 7 opened.

However, in the conventional ETOX type flash EEPROM cell, if the data is erased excessively, a leakage current may flow in the cell. The leakage current is caused by the formation of a floating gate channel coming from the positive charges presenting in the floating gate and the easy migration of the electrons generated in a depletion region adjacent to the source toward the drain. To cope with this problem, the split-gate type flash memory cell has been suggested to suppress the leakage current between the source and the drain.

As a second example, the conventional split-gate type flash EEPROM cell is now described. FIG. 2 illustrates a cross section of the conventional non-volatile memory cell (i.e., the EEPROM).

Referring to FIG. 2, the conventional split-gate type flash EEPROM cell includes a semiconductor substrate 11, a floating gate insulating film 12 formed on the semiconductor substrate 11, a floating gate 13 formed on the floating gate insulating film 12, a control gate insulating film 14 formed on the floating gate insulating film 12 and the floating gate 13, a control gate 15 formed on the control gate insulating film 14, and source 16 and drain 17 formed in the semiconductor substrate on one side of the control gate 15 and one side of the floating gate 13, respectively.

The operations of writing to and reading from the conventional split-gate type flash memory cell are the same as the conventional ETOX type flash memory cell.

Since a channel length of a selecting gate of the conventional split-gate type flash memory cell is longer than that of the conventional ETOX type flash memory cell, the charges in the floating gate suppress the leakage current between the source and drain during an over-erasure. In order to provide a higher packing density in the conventional split-gate type flash memory cells of a non-volatile memory device, a shorter channel length of a selecting gate is desirable. However, the shorter channel length causes an increase of the leakage current due to the punch-through between the drain and the source. Therefore, the higher the packing density of the EEPROM, the shorter the channel length of the selection gate in the conventional flash EEPROM cell. This results in forming a floating gate channel due to the positive charges present in the floating gate 13, as shown in FIG. 3. In addition, the shorter channel length increases the leakage current by causing an easy migration of the electrons either diffused from the source 16 or generated in the depletion region adjacent to the source 16 toward the drain 17. Moreover, since the coplanar formation of the selection transistor and the control transistor in the conventional flash EEPROM increases an occupied area of the transistor, the structure of the conventional flash EEPROM cell is not suitable for fabrication of highly packed devices.

SUMMARY OF THE INVENTION

Accordingly, the present invention is directed to a non-volatile memory device and a method for fabricating the non-volatile memory device that substantially obviates one or more of the problems due to limitations and disadvantages of the related art.

An object of the present invention is to provide a non-volatile memory cell and a method for fabricating the same, that provides an enough channel length of a transistor to suppress a leakage current caused by an over-erasure.

Another object of the present invention is to provide a non-volatile memory cell and a method for fabricating the same, in which a transistor area on a certain plane in a cell can be reduced for high packing density of the cells.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the non-volatile memory device includes a substrate, a projection having two sides formed on the substrate, a floating gate formed on the projection, a control gate formed on the substrate including the floating gate, a first impurity region formed in the substrate extended from one side of the projection, and a second impurity region formed in the substrate at the other side of the projection and in the substrate extended from the other side of the projection.

In another aspect of the present invention, a fabrication method for a non-volatile memory cell including the steps of: providing a substrate, forming a floating gate insulating film on the substrate, forming a floating gate on the floating gate insulating film and a disposable film pattern on the floating gate, selectively removing the floating gate insulating film and the substrate using the disposable film pattern as an etch mask to form a projection, forming sidewall spacers at both sides of the projection, floating gate, floating gate insulating film and disposable film pattern, removing the sidewall spacer at one side of the projection, floating gate, floating gate insulating film and disposable film pattern, injecting impurity ions into the substrate and the other side of the projection, removing the disposable film pattern and the sidewall spacer, and forming a control gate insulating film on the substrate including the sides of the floating gate and the projection and forming a control gate on the control gate insulating film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
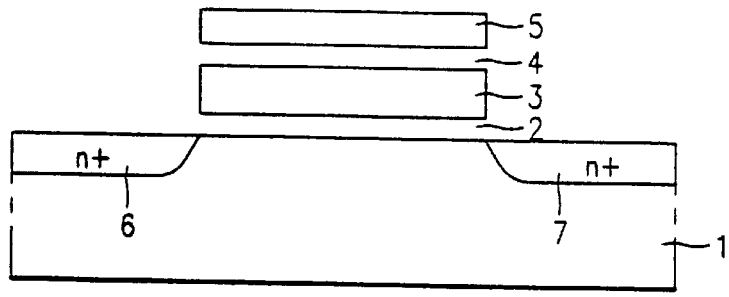
FIG. 1 illustrates a cross-section of a conventional non-volatile memory cell with an ETOX structure.
Figure 2:
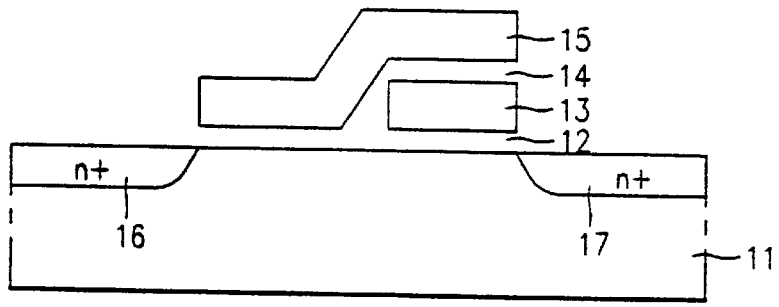
FIG. 2 illustrates a cross-section of a conventional non-volatile memory cell with a split-gate structure.
Figure 3:
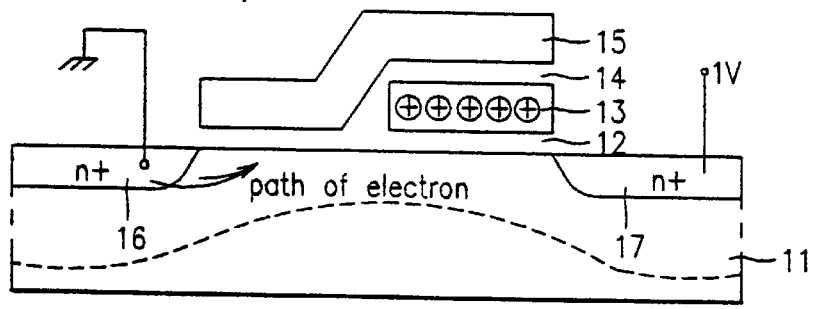
FIG. 3 illustrates a cross-section of the conventional non-volatile memory cell of FIG. 2 showing a leakage current flow during a writing operation.
Figure 4:
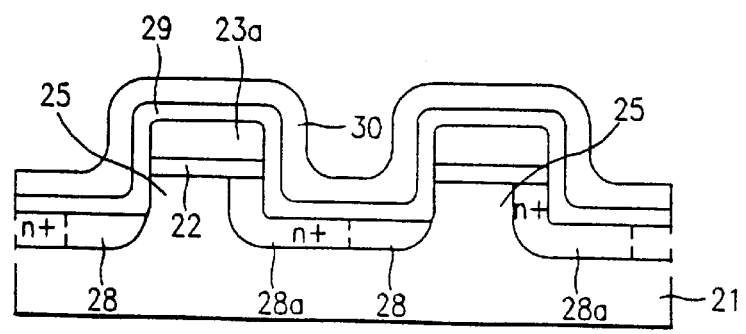
FIG. 4 illustrates a cross-section of a non-volatile memory cell in accordance with a preferred embodiment of the present invention.

FIG. 4 illustrates a cross-section of a non-volatile memory cell in accordance with a preferred embodiment of the present invention.

Referring to FIG. 4, the non-volatile memory cell of the present invention includes a substrate 21, a projection or a protruding portion 25 having two sides formed on the substrate 21, a floating gate 23a formed on the projection 25, a control gate 30 formed on the substrate 21 including the floating gate 23a, a first impurity region 28 formed in the substrate 21 extended from one side of the projection 25, and a second impurity region 28a formed in the substrate 21 at the other side of the projection 25 and extended from the other side of the projection 25. A floating gate insulating film 22 is formed between the floating gate 23a and the projection 25. A control gate insulating film 29 is formed between the control gate 30 and the semiconductor substrate 21 including sides of the floating gate 23a, floating gate insulating film 22 and the projection 25. One side of the projection 25 forms a channel region.

A method for fabricating a non-volatile memory device in accordance with a preferred embodiment of the present invention is explained with reference to FIGS. 5a–5i.

Figure 5A:
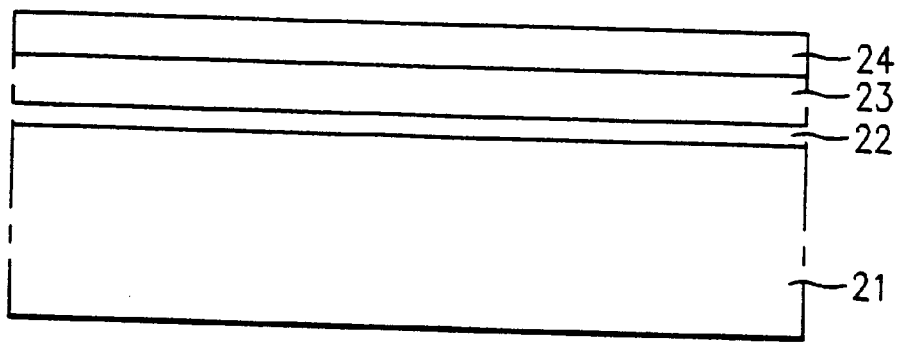
FIGS. 5a–5i illustrate cross-sections showing the steps of a process for fabricating a non-volatile memory cell in accordance with a preferred embodiment of the present invention.

Referring to FIG. 5a, a p-type semiconductor substrate 21 is provided, and an insulating film (for example, an oxide film) is deposited on the semiconductor substrate 21 to form a floating gate insulating film 22. Thereafter, a polysilicon film 23 and a disposable film (for example, a CVD oxide film) 24 are formed on the floating gate insulating film 22 in succession.

Figure 5B:
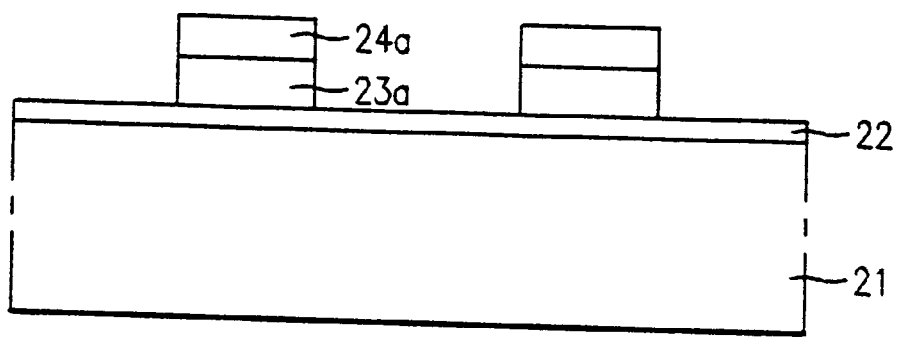

Referring to FIG. 5b, the disposable film 24 and the polysilicon film 23 are subjected to photolithography to form a patterned disposable film 24a and a floating gate 23a.

Figure 5C:
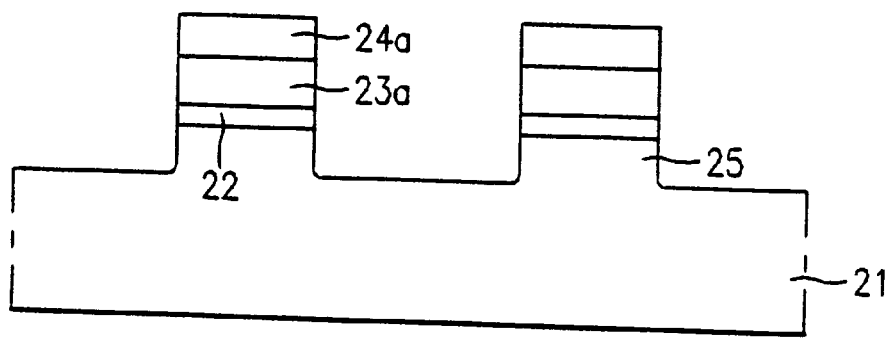

Referring to FIG. 5c, the floating gate insulating film 22 and the semiconductor substrate 21 are selectively removed using the patterned disposable film 24a as a mask to form a projection 25 on the semiconductor substrate 21. One side of the projection 25 is used as a channel region of a transistor having a channel length of the height of the projection 25. Although not shown in the drawing, a second insulating film is deposited on the semiconductor substrate 21 including the sides of the disposable film pattern 24a, floating gate 23a, floating gate insulating film 22 and projection 25. The second insulating film has an etching rate higher than the insulating material used as a disposable film. For example, BPSG is a suitable material for the second insulating film.

Figure 5D:
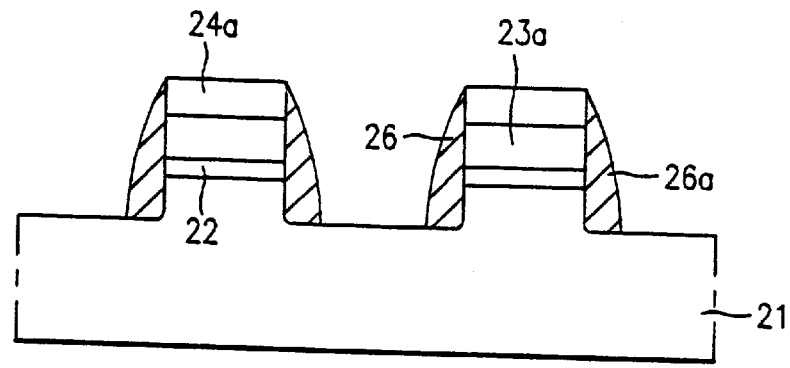

Referring to FIG. 5d, the second insulating film is subjected to anisotropic etching using a dry etching method so as to leave the second insulating film only on both sides of the disposable film pattern 24a, floating gate 23a, floating gate insulating film 22, and projection 25 in order to form sidewall spacers 26 and 26a. Then, a photoresist film 27 is coated on the semiconductor substrate 21 including the sidewall spacers 26 and 26a and the disposable film pattern 24a (not shown in FIG. 5d).

Figure 5E:
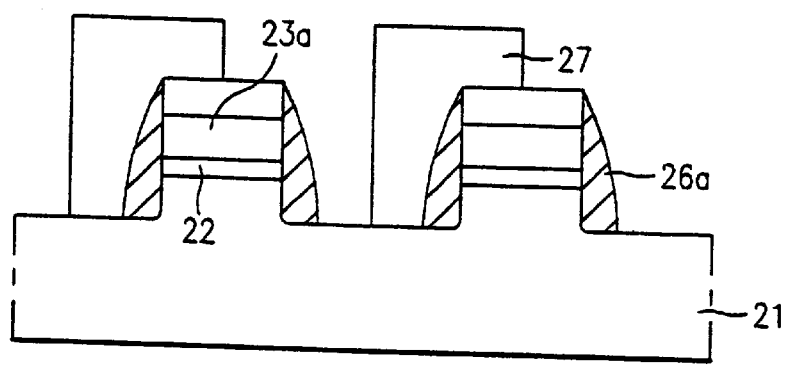

Next, referring to FIG. 5e, the photoresist film 27 is selectively removed so as to leave the photoresist film 27 only on a portion of the disposable film pattern 24a, on the sidewall spacer 26 and on a portion of the semiconductor substrate 21.

Figure 5F:
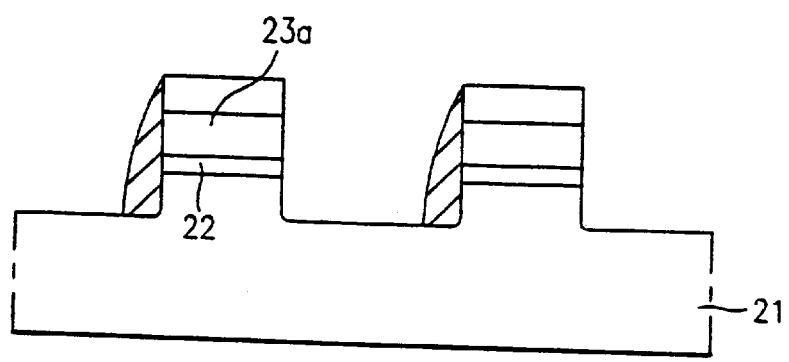

Referring to FIG. 5f, after the sidewall spacer 26a (not covered with the photoresist film 27) is removed by wet etching, remaining photoresist film 27 is removed. Since the sidewall spacer 26a has an etching rate higher than the disposable film pattern 24a, a predetermined thickness of the disposable film pattern 24a remains even after the sidewall spacer 26a is fully etched. Alternatively, the sidewall spacer 26a may be dry etched instead of wet etching.

Figure 5G:
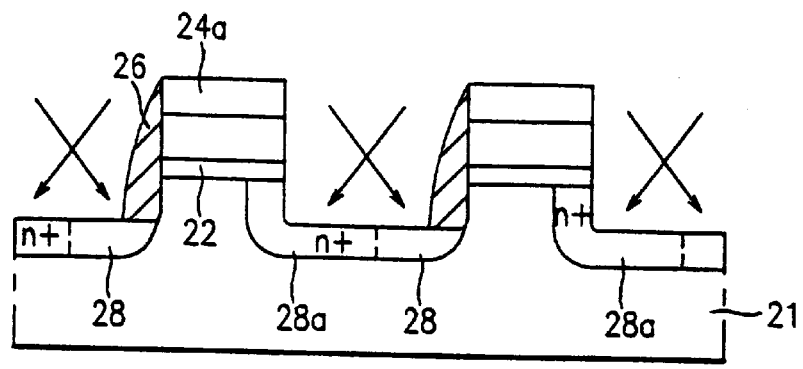

Referring to FIG. 5g, a high concentration of n-type (n+) impurity ions are implanted into the semiconductor substrate 21 using the patterned disposable film 24a and the sidewall spacer 26 as masks. The ion implantation is executed with a large-tilted angle(about 30~60° with respect to the substrate 21) so that the ions can be injected mainly into one side of the projection 25. Thus, a first impurity region 28 is formed in the semiconductor substrate 21 extended from one side of the projection 25, and a second impurity region 28a is formed at the other side of the projection 25 and in the semiconductor substrate 21 extended from the other side of the projection 25.

Figure 5H:
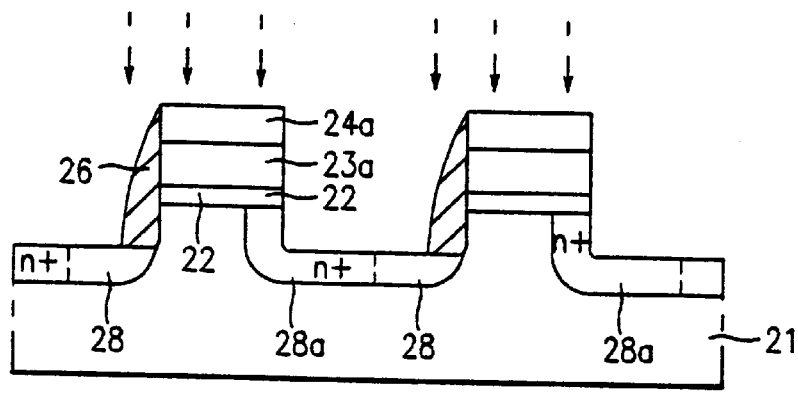

Then, referring to FIG. 5h, the disposable film pattern 24a and the sidewall spacer 26 are removed by either dry etching or wet etching.

Figure 5I:
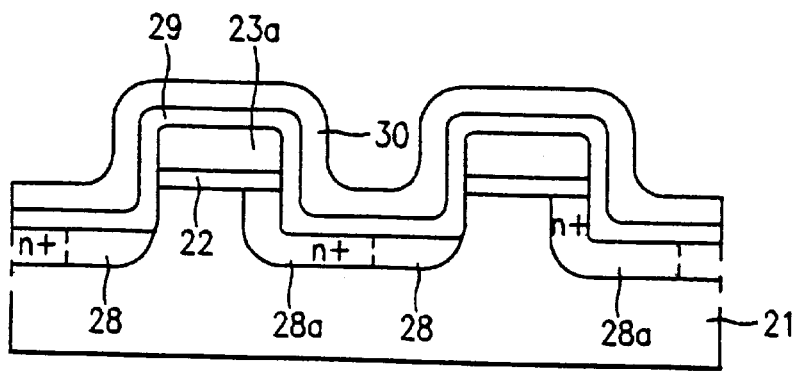

Referring to FIG. 5i, a control gate insulating film 29 (for example, an oxide film) is formed on the semiconductor substrate 21 including on the sides of the floating gate 23a, floating gate insulating film 22, and projection 25. Then, polysilicon is deposited on the control gate insulating film 29, to form a control gate 30.

Accordingly, in the non-volatile memory cell of the present invention, a side of a protrusion extending from a substrate is used to provide enough channel length to suppress a leakage current caused by over-erasure.

The non-volatile memory device of the present invention has the following advantages.

Since an additional portion of predetermined semiconductor substrate is used as a channel region defined at a side of a semiconductor substrate, the non-volatile memory device of the present invention can provide enough channel length to suppress the leakage current caused by over-erasure. Thus, the non-volatile memory device of the present invention is suitable for a high packing density device since the extended portion of channel region at the side of the substrate reduces the area occupied by a transistor on a same plane of the substrate. Moreover, since the floating gate is completely surrounded by the control gate, an effective area for capacitance is substantially enlarged with an increase of coupling ratio (that is, a ratio of a voltage applied to the control gate to a voltage induced in the floating gate). Subsequently, the increased coupling ratio results in faster programming and erasing speeds in the device.

It will be apparent to those skilled in the art that various modifications and variations can be made in method for fabricating a non-volatile memory device of the present invention without departing from the spirit or scope of the invention. Thus, it is intended that the present invention cover the modifications and variations of this invention provided they come within the scope of the appended claims and their equivalents.

What is claimed is:

1. A method for fabricating a non-volatile memory device, the method comprising the steps of:
   providing a substrate;
   simultaneously forming a protruding portion extending from the substrate and a floating gate over the protruding portion, the protruding portion having first and second sides;
   forming first impurity regions in the substrate and second impurity regions both in the substrate and the second side of the protruding portion, the first and second impurity regions acting as source and drain regions, respectively, wherein the first and second impurity regions at the same side of the projection are directly adjacent to each other, and the second impurity region has an impurity concentration higher than the first impurity region; and
   forming a control gate over the floating gate.

2. The method for fabricating a non-volatile memory device according to claim 1, wherein the substrate is formed of semiconductor.

3. The method for fabricating a non-volatile memory device according to claim 1, wherein the floating gate is formed of polysilicon.

4. The method for fabricating a on-volatile memory device according to claim 1, wherein the control gate is formed of polysilicon.

5. The method for fabricating a non-volatile memory device according to claim 1, wherein the step of forming the protruding portion and the floating gate includes the steps of:
   forming a floating gate insulation film on the substrate;
   forming a floating gate film and a disposable film over the floating gate insulation film in succession; and
   patterning the floating gate insulating film and the substrate to produce the floating gate and the protruding portion.

6. The method for fabricating a non-volatile memory device according to claim 1, wherein the step of forming the impurity regions includes the steps of:
   forming a sidewall spacer on one side of the protruding portion and the floating gate; and
   injecting impurity ions into the substrate and the second side of the protruding portion.

7. A method for fabricating a non-volatile memory device, the method comprising the steps of:
   providing a substrate;
   forming a floating gate insulating film on the substrate;
   forming a floating gate on the floating gate insulating film and a disposable film on the floating gate;
   patterning the floating gate insulating film, the disposable film, and the substrate to form a projection having first and second sides;
   forming first and second sidewall spacers at first and second sides of the projection, respectively;
   removing the first sidewall spacer;
   injecting impurity ions into the substrate and the projection to form first impurity regions in the substrate and second impurity regions both in the substrate and the second side of the projection, the first and second impurity regions acting as source and drain regions, respectively, wherein the first and second impurity regions at the same side of the projection are directly adjacent to each other, and the second impurity region has an impurity concentration higher than the first impurity region;
   removing the disposable film and the second sidewall spacer;
   forming a control gate insulating film on the substrate including sides of the floating gate and the projection; and
   forming a control gate on the control gate insulating film.

8. The method for fabricating a non-volatile memory device according to claim 7, wherein the floating gate is formed of polysilicon.

9. The method for fabricating a non-volatile memory device according to claim 7, wherein the floating gate insulating film is formed of an oxide.

10. The method for fabricating a non-volatile memory device according to claim 7, wherein the disposable film is formed of an oxide using chemical vapor deposition.

11. The method for fabricating a non-volatile memory device according to claim 7, wherein the first and second sidewall spacers are formed of an insulating film having an etch rate higher than an etch rate of the disposable film.

12. The method for fabricating a non-volatile memory device according to claim 11, wherein the insulating film is formed of BPSG.

13. The method for fabricating a non-volatile memory device according to claim 7, wherein the step of removing the first sidewall spacer includes the step of coating a photoresist film over the second sidewall spacer as a mask.

14. The method for fabricating a non-volatile memory device according to claim 13, wherein the step of removing the first sidewall spacer further includes the step of wet etching.

15. The method for fabricating a non-volatile memory device according to claim 13, wherein the step of removing the first sidewall spacer further includes the step of dry etching.

16. The method for fabricating a non-volatile memory device according to claim 7, wherein the step of injecting the impurity ions includes the step of injecting the impurity ions at angles with respect to the substrate.

17. The method for fabricating a non-volatile memory device according to claim 16, wherein the angles in the injecting step are in the range of approximately 30 to 60 degrees.

18. The method for fabricating a non-volatile memory device according to claim 7, wherein the control gate is formed of polysilicon.

19. A method for fabricating a non-volatile memory device, the method comprising the steps of:

providing a semiconductor substrate;

forming a first oxide layer on the semiconductor substrate;

forming a polysilicon layer on the first oxide layer;

forming a second oxide layer on the polysilicon layer;

patterning the polysilicon layer and the semiconductor substrate using the second oxide layer as an etch stop layer to form a projection;

forming a first sidewall spacer and a second sidewall spacer on a first side of the projection and a second side of the projection, respectively;

removing a first sidewall spacer from the first side of the projection by masking the second sidewall spacer;

injecting impurity ions into the semiconductor substrate and the projection at an angle with respect to the semiconductor substrate to form first impurity regions in the substrate and second impurity regions both in the substrate and the second side of the projection, the first and second impurity regions acting as source and drain regions, respectively, wherein the first and second impurity regions at the same side of the projection are directly adjacent to each other, and the second impurity region has an impurity concentration higher than the first impurity region;

removing the disposable film and the second sidewall spacer;

forming a third oxide layer on the semiconductor substrate, the floating gate, and the projection; and forming a polysilicon layer as a control gate on the control gate insulating film.

20. The method for fabricating a non-volatile memory device according to claim 19, wherein the first sidewall spacer and the second sidewall spacer are formed of an insulating film having an etch rate higher than an etch rate of the disposable film.

21. The method for fabricating a non-volatile memory device according to claim 20, wherein the insulating film is formed of BPSG.

22. The method for fabricating a non-volatile memory device according to claim 19, wherein the step of removing one of the sidewall spacers includes at least one of wet and dry etching processes.

* * * * *